United States Patent [19]

Sato et al.

[11] Patent Number: 4,983,543

[45] Date of Patent: Jan. 8, 1991

[54] METHOD OF MANUFACTURING A SEMICONDUCTOR INTEGRATED CIRCUIT HAVING AN INTERCONNECTION WIRE EMBEDDED IN A PROTECTIVE LAYER COVERING THE SEMICONDUCTOR INTEGRATED CIRCUIT

[75] Inventors: Yasuhisa Sato, Isehara; Takushi Motoyama, Kawasaki, both of Japan

[73] Assignee: Fujitsu Limited, Kawasaki, Japan

[21] Appl. No.: 401,690

[22] Filed: Sep. 1, 1989

[30] Foreign Application Priority Data

Sep. 7, 1988 [JP] Japan .................. 63-222273
Nov. 16, 1988 [JP] Japan .................. 63-289208
Dec. 23, 1988 [JP] Japan .................. 63-326687

[51] Int. Cl.$^5$ .......................................... H01L 21/44
[52] U.S. Cl. ................................ 437/192; 437/194; 437/200; 437/193
[58] Field of Search ..................... 437/194, 200, 192

[56] References Cited

U.S. PATENT DOCUMENTS

| | | | |
|---|---|---|---|
| 4,283,439 | 8/1981 | Higashinakagawa et al. | 437/192 |
| 4,582,563 | 4/1986 | Hazuki et al. | 437/192 |
| 4,584,207 | 4/1986 | Wilson . | |
| 4,617,193 | 10/1986 | Wu | 437/195 |
| 4,746,621 | 5/1988 | Thomas et al. | 437/200 |
| 4,764,484 | 8/1988 | Mo | 437/192 |

FOREIGN PATENT DOCUMENTS 139026 6/1986 Japan .
141740 6/1987 Japan .

OTHER PUBLICATIONS

"High-Density High-Reliability Tungsten Interconnection by Filled Interconnect Groove Metallization", IEEE Transactions on Electron Devices, vol. 35, No. 7, Jul. 1988.

S. K. Ghandhi, *VLSI Fabrication Principles*, John Wiley & Sons, New York, (1983), pp. 424-427.

*Primary Examiner*—Brian E. Hearn
*Assistant Examiner*—Laura M. Holtzman
*Attorney, Agent, or Firm*—Armstrong, Nikaido, Marmelstein, Kubovick & Murray

[57] ABSTRACT

A method of manufacturing a semiconductor integrated circuit comprises steps of forming at least one semiconductor device on a substrate, depositing an insulator layer on the substrate so as to bury the semiconductor device, providing a contact hole through the insulator layer for exposing a desired part of the semiconductor device, filling the contact hole by a refractory metal for electrical connection, covering the insulator layer by a second insulator layer, forming a groove through the second insulator layer according to a predetermined interconnection pattern such that the groove passes at least one contact hole and such that a top surface of the refractory metal filling the contact hole and a top surface of the first insulator layer are exposed by the groove, forming a material layer acting as nuclei for crystal growth of a second refractory metal at a bottom of the groove substantially continuously along the groove, and depositing the second refractory metal in the groove until the groove is substantially filled by a conductor of the second refractory metal.

14 Claims, 14 Drawing Sheets

METHOD OF MANUFACTURING A SEMICONDUCTOR INTEGRATED CIRCUIT HAVING AN INTERCONNECTION WIRE EMBEDDED IN A PROTECTIVE LAYER COVERING THE SEMICONDUCTOR INTEGRATED CIRCUIT

BACKGROUND OF THE INVENTION

The present invention generally relates to interconnection of semiconductor integrated circuits and more particularly to a method of growing a refractory metal in a groove formed in an insulator layer covering a semiconductor device in an integrated circuit such that the semiconductor devices are connected by a wire of the refractory metal filling the groove.

Generally, aluminium is used for connecting various semiconductor devices in conventional integrated circuits. In the integrated circuits, the semiconductor devices are buried under an insulator layer such as phosphosilicate glass (PSG) or silica (SiO$_2$) and electrical interconnection for achieving a desired circuit is made through a contact hole provided on the insulator layer in correspondence to the semiconductor device. In a typical procedure for establishing such an electrical interconnection, a layer of aluminium is deposited on the insulator layer including the contact holes and the aluminium layer thus deposited is then patterned by etching. Aluminium is preferred because of its low resistivity and firm contact with the insulator layer underneath.

However, aluminium interconnection has a problem in that it is susceptible to electromigration. As a consequence, there is a substantial risk that the electrical connection fails particularly when the thickness or width of aluminium wire used for interconnection is reduced. Note that very large scale integrated circuits (VLSI) currently studied for future deployment use a conductor width of about 0.4 μm or less. Further, such an extremely fine aluminium wire is fragile to the stress migration as is commonly known. Furthermore, as the height of the wire cannot be reduced below about 1 μm in order to secure sufficiently low resistance and sufficiently low current density, the wire has to have a very large aspect ratio or height/width ratio which obviously invites mechanical as well as electrical unstability. More specifically, when a protective layer of PSG and the like is provided on the insulator layer so as to bury the conductor strip having such a high aspect ratio for protection, the protective layer thus deposited tends to have a surface which is undulated in correspondence to the conductor strip underneath. Associated therewith, there is a substantial risk that a top part of the conductor strip extending upwards from the insulator layer is not sufficiently covered or even exposed. When this occurs, conductor layer or wires provided above the protective layer to form a multilevel interconnection may be damaged or contacted to the wires in the underlying layer. Further, there may be an unfilled space remained between adjacent conductor strips particularly when the integration density of the integrated circuit is increased and the separation between the conductor strips is reduced.

In order to avoid foregoing problems, it is studied to use refractory metals such as tungsten which suffers less from internal stress because of relatively small thermal expansion and which is less susceptible to the electromigration because of large bonding energy, in place of aluminium. Further, in order to achieve a mechanical stability, it is studied to grow the metal conductor strip directly in a groove which is previously provided on the insulator layer. Note that refractory metal such as tungsten tends to be detached from a substrate when deposited uniformly in a form of layer with a thickness exceeding about 1 μm.

Meanwhile, there are a number of known methods of growing refractory metals on a part of semiconductor device exposed by a contact hole such that the contact hole is filled by the refractory metal. Thus, Japanese Laid-open Patent Applications No. 72131/1984 and No. 125647/1987, for example, describe filling of the contact hole by selective growth of tungsten on the part of the semiconductor device exposed by the contact hole. As the growth of tungsten is started from the semiconductor device at the bottom of the contact hole, the obtained tungsten layer filling the contact hole is dense and a solid connection is achieved between the tungsten and the aluminium conductor wire extending above the insulator layer in which the contact hole is penetrated. In any of these prior art methods, the selective growth of tungsten is simply achieved by usual chemical vapor deposition technique, as the tungsten atoms formed as a result of decomposition of source gas are preferentially deposited on a semiconductor surface of the device rather than on a side wall or top surface of the insulator layer.

When filling the groove provided on the insulator layer by tungsten, such a simple procedure of deposition is not possible as there is no exposed semiconductor part on which tungsten is preferentially deposited. This, Laid-open Japanese Patent Application No. 139026/1986 in which the applicant is the assignee of the present application, describes initial deposition of polycrystalline silicon on a side wall as well as on a bottom of the groove and subsequent deposition of tungsten using such a polysilicon layer as the nuclei. According to this procedure, however, there is a problem in that the growth of tungsten is made laterally from both side walls and there is a substantial risk that void remains in the tungsten filling the groove because of the lateral growth which tends to close a top opening of the groove.

Alternatively, Japanese Laid-open Patent Application No. 141740/1987 discloses a method wherein the side wall of the groove is covered by polysilicon and the growth of tungsten is achieved laterally, starting from such a polysilicon layer covering the side wall of the groove. According to this method, too, there is a problem of void formation associated with the lateral growth of tungsten. Such a void in the interconnection wire increases the resistivity as well as the chance that the interconnection is failed.

SUMMARY OF THE INVENTION

Accordingly, it is a general object of the present invention to provide a novel and useful method of manufacturing a semiconductor integrated circuit having an interconnection wire embedded in a protective layer covering the semiconductor integrated circuit wherein the aforementioned problems are eliminated.

Another object of the present invention is to provide a method of manufacturing a semiconductor integrated circuit having an interconnection wire embedded in a protective layer covering the semiconductor integrated circuit wherein the interconnection wire comprises a refractory metal free from void.

Another object of the present invention is to provide a method of manufacturing a semiconductor integrated circuit having an interconnection wire embedded in a protective layer covering the semiconductor integrated circuit, wherein a material acting as a nuclei for crystal growth of a refractory metal is deposited on a bottom of a groove provided on the protective layer in correspondence to a desired interconnection pattern, and the refractory metal is grown in the groove starting from the nuclei thus provided so as to fill the groove. According to the present invention, a solid interconnection wire of the refractory metal substantially free from void and firmly supported by the insulator layer can be obtained in a state to fill the groove, as the growth of the refractory metal starts from the nuclei at the bottom of the groove and proceeds upwards sequentially. As a result, a flat surface is obtained at the top of the protective layer and a multilevel interconnection can be achieved without risk of damaging the wire or short-circuiting the wires in the adjacent layers. Further, as a result of use of the refractory metal such as tungsten, molybdenum, titanium or tantalum having a large bond energy and high mechanical strength, the electromigration and stress migration pertinent to the hitherto employed aluminium interconnection wire is successfully avoided.

Other objects and further features of the present invention will become apparent from the following detailed description when read in conjunction with attached drawings.

DETAILED DESCRIPTION

Figure 1:
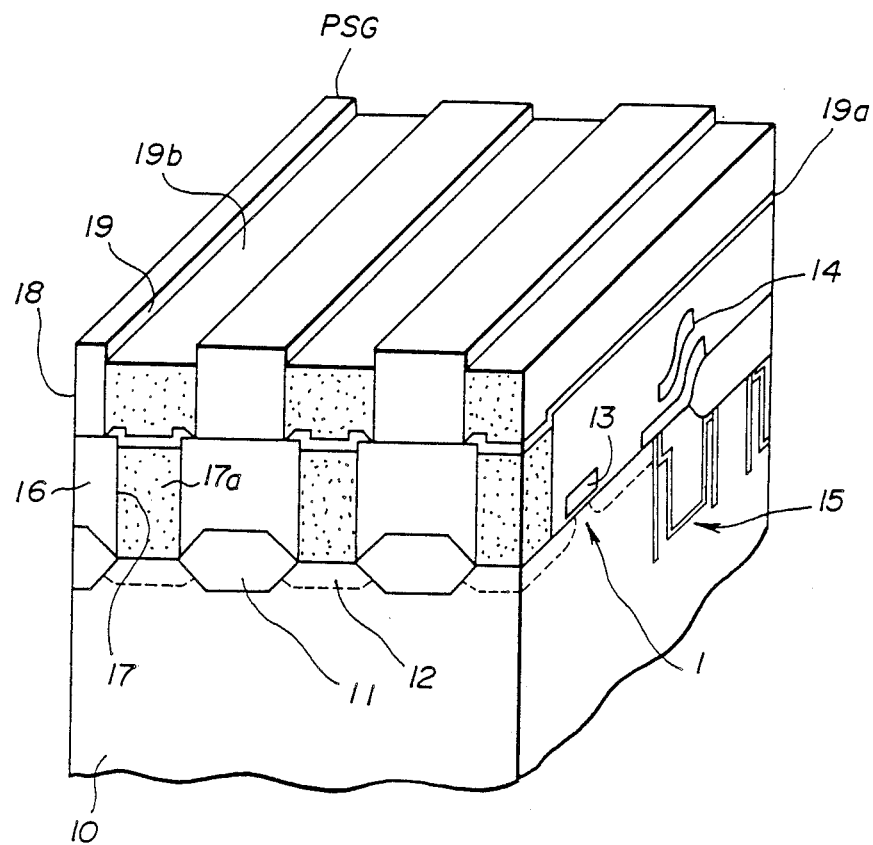
FIG. 1 is a perspective view showing a part of an integrated circuit to which the present invention is applicable.

FIG. 1 shows a part of an integrated circuit in which the present invention is applied. Referring to FIG. 1, the integrated circuit is a dynamic random access memory (DRAM) including a number of MOS transistors 1 and comprises a substrate 10 of doped silicon, a field oxide layer 11 provided on the substrate 10 for defining a region where the transistor is to be formed, and a doped diffusion region 12 formed in the substrate 10 between a pair of field oxide layers 11 as a source or drain region of the MOS transistor 1. Further, there are formed a gate oxide 13, a word line 14, a capacitor 15 and the like as illustrated. The integrated circuit is covered by an insulator layer 16 such as PSG or silica for electrical insulation as well as for surface protection.

In the description hereinafter, the present invention will be described with reference to such a DRAM device using the MOS transistor. However, the present invention is by no means limited to the DRAM device but is applicable to any other integrated circuits and devices.

In order to achieve an electrical connection to the MOS transistors 1 in the integrated circuit, the insulator layer 16 is provided with a contact hole 17 in correspondence to the source, drain or gate of the transistor and the contact hole 17 is filled by a refractory metal 17a such as tungsten which is selectively grown on a part of the MOS transistor 1 exposed by the contact hole 17. In the description hereinafter, the term "refractory metal" is used in a sense that it may contain small amount of impurities. As already noted, the refractory metal 17a is preferentially deposited on a part of the semiconductor device exposed by the contact hole 17 rather than on the side wall of the contact hole 17 and there is no difficulty in filling the contact hole 17 from its bottom to the top by usual chemical vapor deposition and the like without creating void.

Further, in order to connect the MOS transistors in the integrated circuit according to a desired interconnection pattern to construct a desired DRAM circuit, the refractory metal filling the contact hole 17 is connected each other by a refractory metal conductor or wire extending above the insulator layer 16. As already noted with reference to the evaluation of the prior art devices, mere deposition of the refractory metal on the insulator layer 16 and subsequent patterning is unreliable as the refractory metal tends to be detached from the insulator layer 16 when deposited uniformly with a thickness of about 1 μm or more because of the large compressive stress developed in the metal when deposited in a form of large sheet.

In the present invention, another insulator layer 18 of PSG or silica is deposited on the insulator layer 16 and a groove 19 is formed in the insulator layer 16 in correspondence to a desired interconnection pattern so as to penetrate through the layer 18. Note that the groove 19 exposes a top surface of the insulator layer 16 or a top surface of the refractory metal 17a filling the contact hole 17. Further, a layer 19a of a material such as tungsten or tungsten silicide which acts as a nuclei for subsequent growth of the refractory metal is formed at the bottom of the groove 19 and a refractory metal strip or wire 19b is then grown in the groove 19 starting from its bottom using the layer 19a as the nuclei. According to the present invention, the refractory metal wire 19b is grown from the bottom of the groove 19 to its top and undesirable formation of void or defects in the wire 19b due to the lateral growth of the refractory metal starting from the side wall of the groove 19 is effectively eliminated.

Next, a first embodiment of the present invention for depositing a refractory metal in a groove formed in an insulator layer for interconnection of integrated circuit will be described with reference to FIGS. 2(A)–(J) showing a part of the integrated circuit of FIG. 1.

Figure 2:
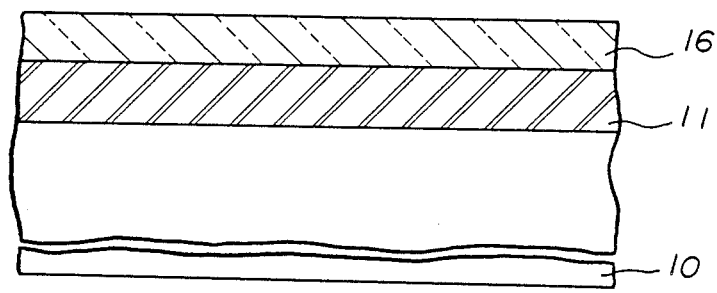
FIGS. 2(A)–(J) are cross sectional views showing various steps of forming the structure of FIG. 1 according to a first embodiment of the present invention.
Figure 2:
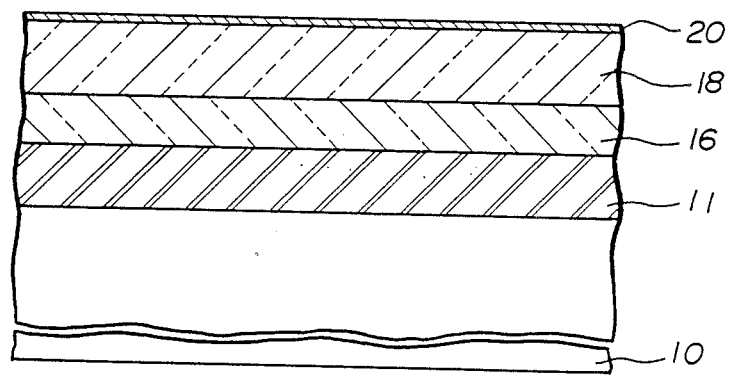
Figure 2C:
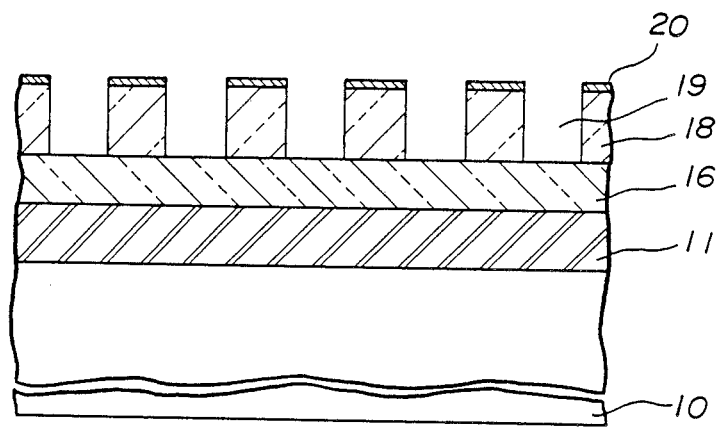
Figure 2D:
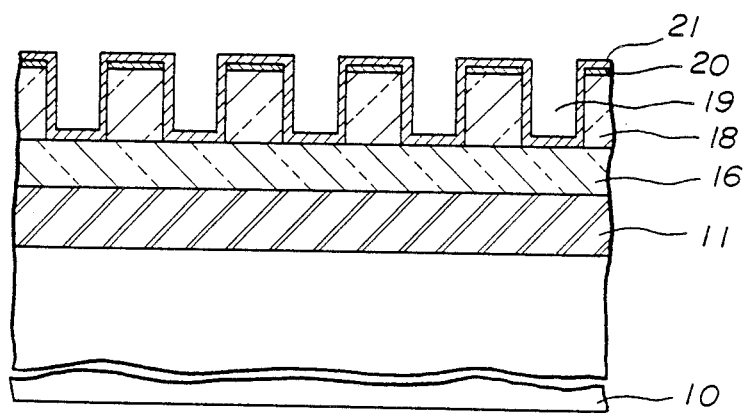
Figure 2E:
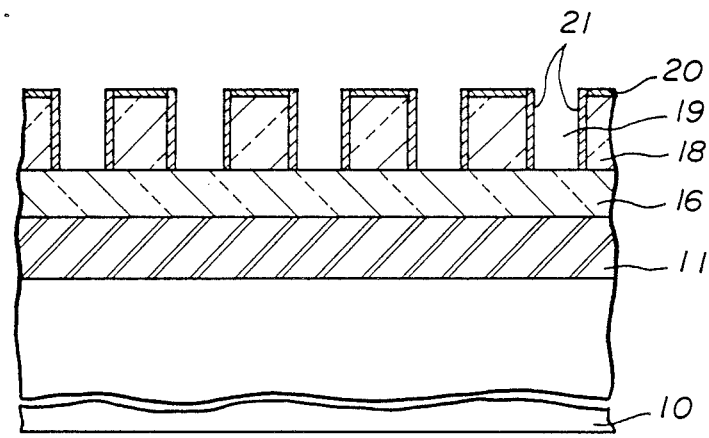
Figure 2F:
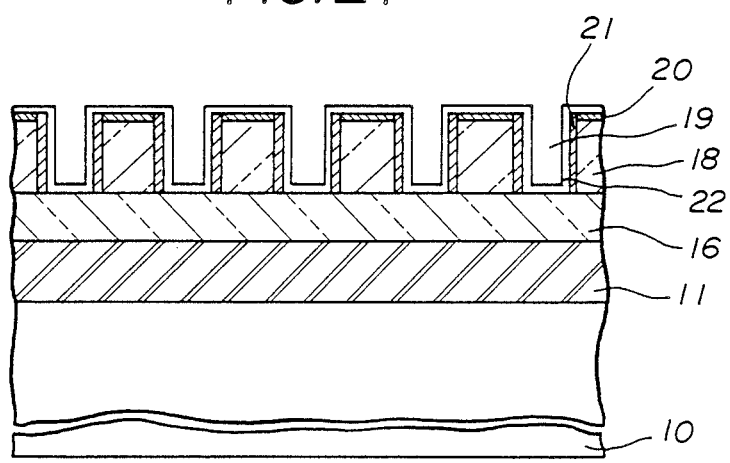
Figure 2G:
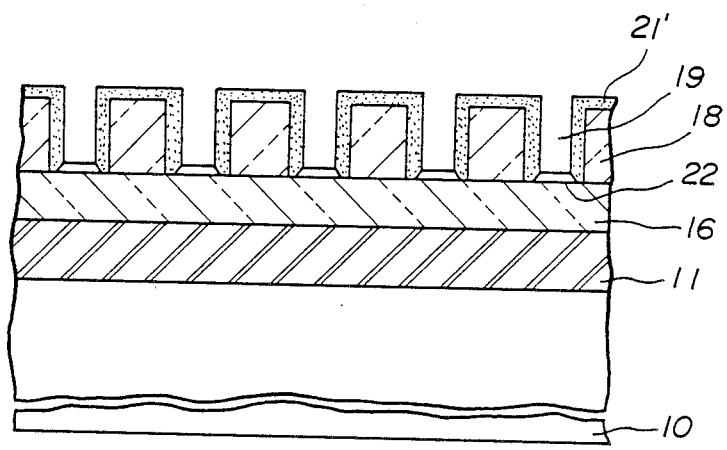
Figure 2H:
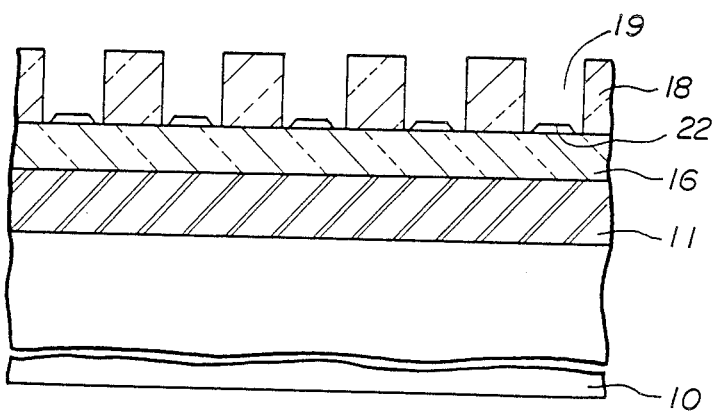
Figure 2:
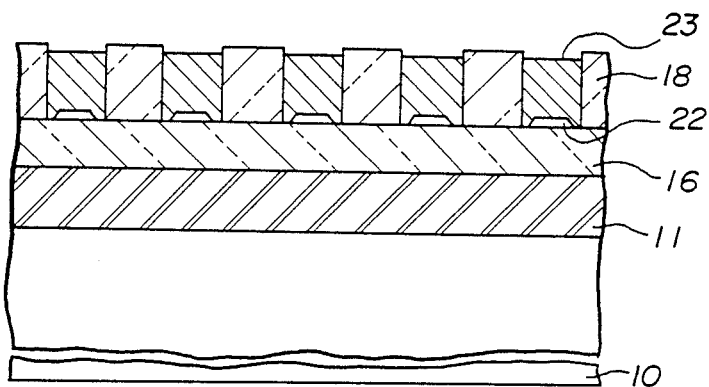
Figure 2:
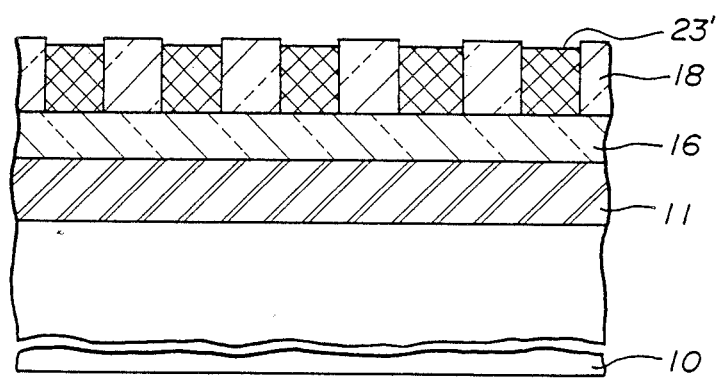
Figure 2A:
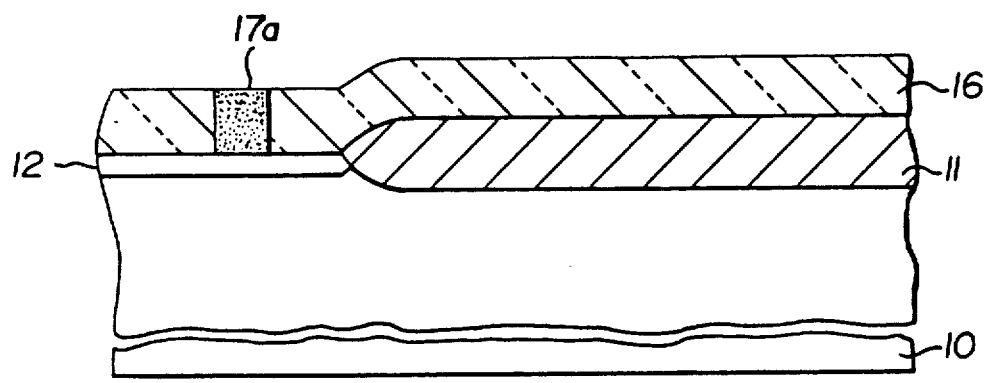

Referring to FIG. 2(A), the substrate 10 is covered by the field oxide layer 11 for device isolation and the semiconductor device such as MOS transistor 1 is formed as illustrated in FIG. 1. Note that the MOS transistor 1 is formed in a region outside of FIG. 2(A) by well established process. Further, the structure thus formed is covered by the PSG insulator layer 16 and the layer 16 is provided with the contact hole 17 which is filled by tungsten by a known procedure such as reduction of a source gas such as tungsten hexafluoride (WF$_6$) by using hydrogen or silane. Such a contact hole is illustrated in FIG. 1. Note that the contact hole 17, too, is formed in the region outside of FIG. 2(A).

Figure 2B:
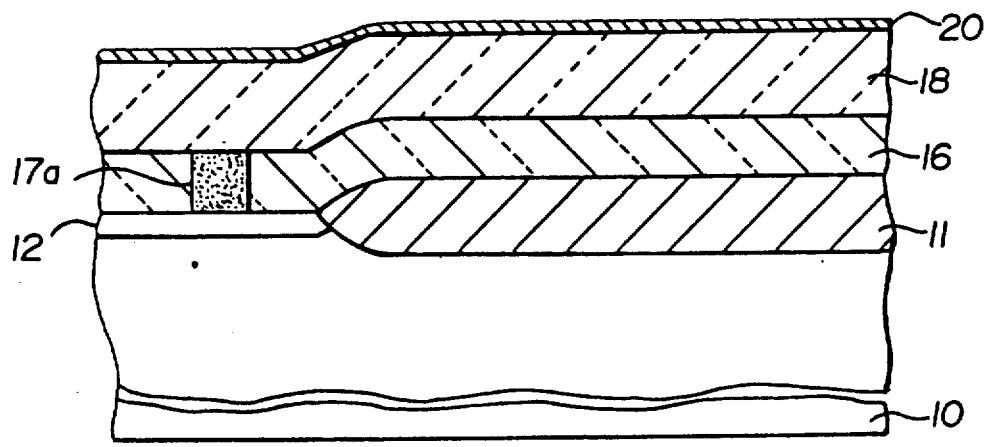
Figure 2C:
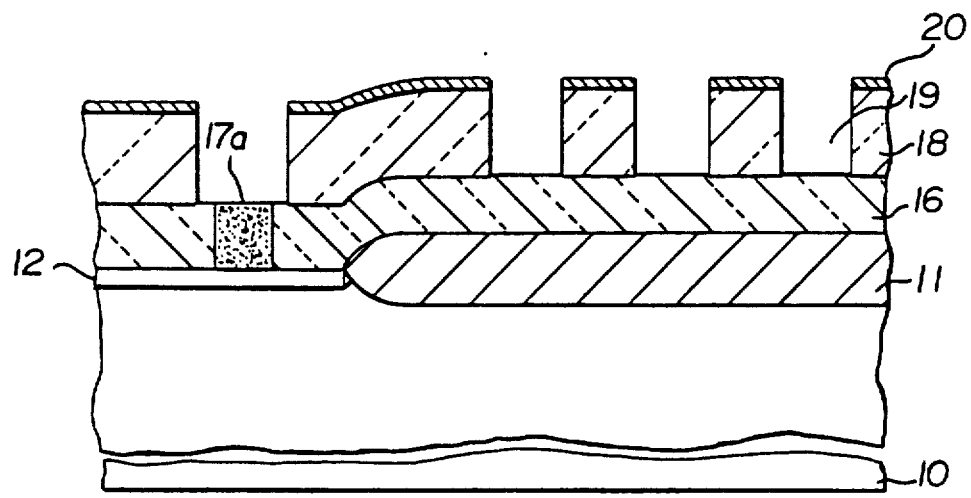
Figure 2D:
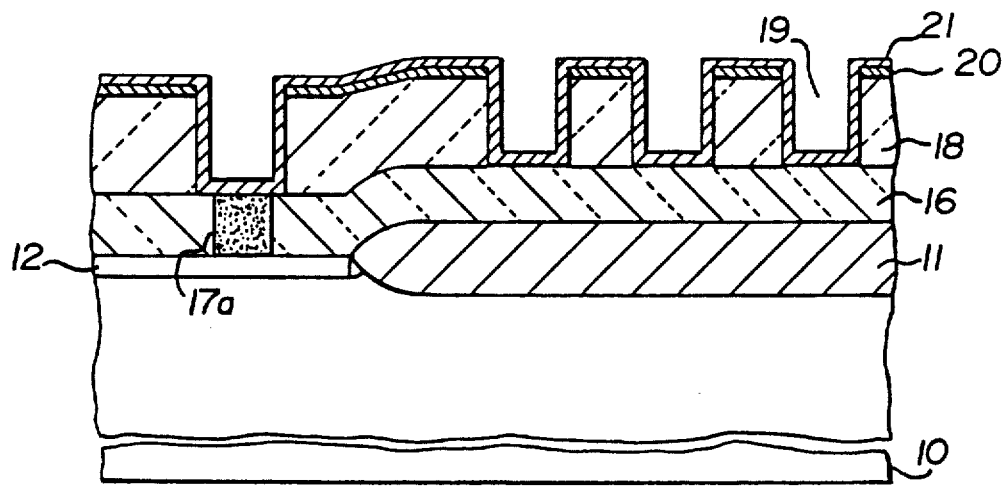
Figure 2E:
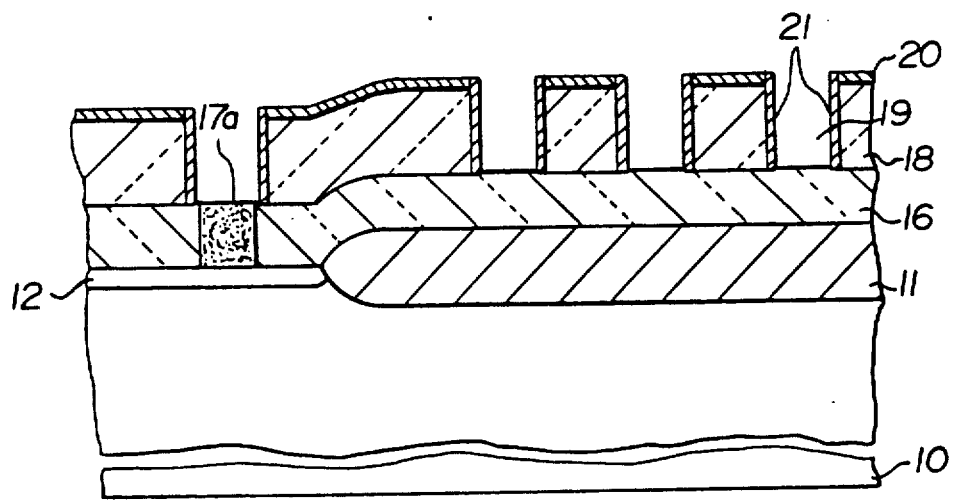
Figure 2F:
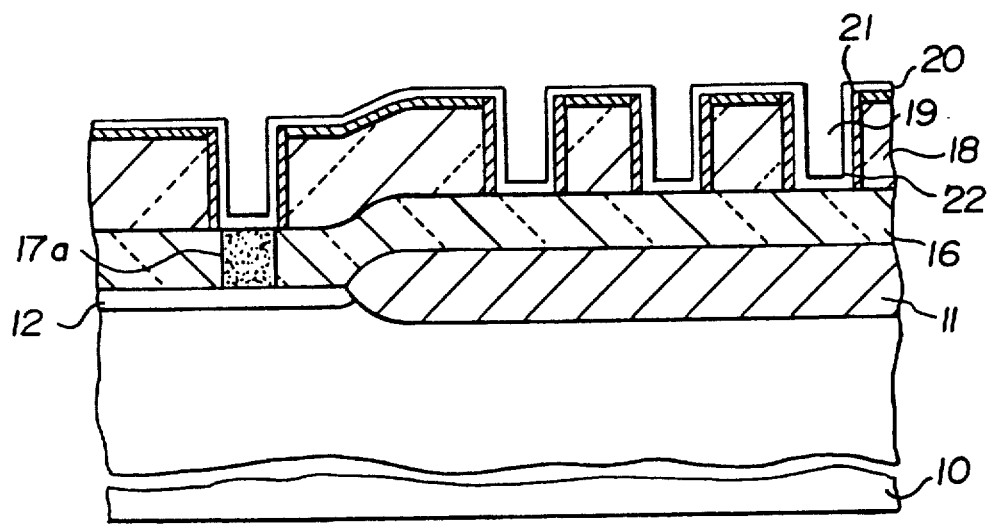
Figure 2G:
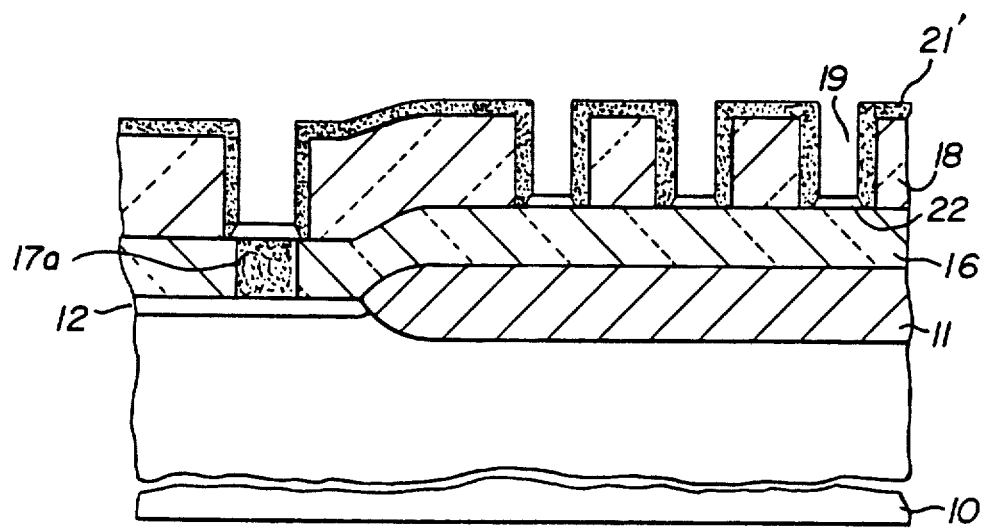
Figure 2H:
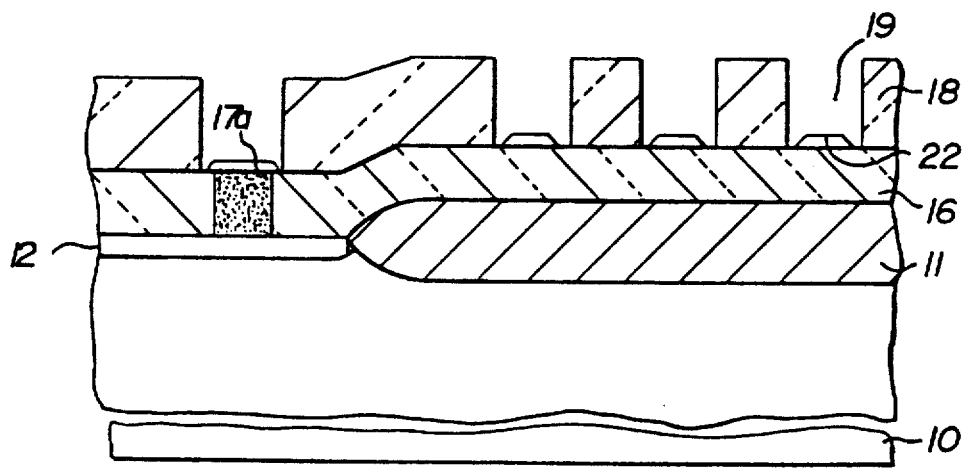

In a step of FIG. 2(B), the structure of FIG. 2(A) is further covered by the insulator layer 18 which may also comprise PSG having a thickness of about 1.2 μm. Further, the PSG layer 18 is covered by a metal layer 20 of titanium sputtered thereon with a thickness of about 500 Å. Next, the groove 19 is formed so as to penetrate through the PSG layer 18 as well as through the titanium layer 20 according to the predetermined interconnection pattern by applying the reactive ion etching (RIE) process combined with known photolithographic patterning technique as shown in FIG. 2(C) until a top surface of the underlying PSG layer 16 is exposed. Next, another metal layer 21 of titanium is deposited on the entire structure of FIG. 2(C) by sputtering for a thickness of about 500 Å as shown in FIG. 2(D). Thereafter, titanium layer 21 at the top of the PSG layer 18 as well as at the bottom of the groove 19 is removed by RIE using carbon tetrafluoride ($CF_4$) as an etching gas, and a structure shown in FIG. 2(E) is obtained. In FIG. 2(E), it should be noted that titanium is left on a side wall of the groove 19 in a form of the layer 21 and at the top of the PSG layer in a form of the layer 20 which is previously deposited in the step of FIG. 2(B).

Further, an amorphous silicon layer 22 is deposited on the entire structure of FIG. 2(E) by sputtering for a thickness of about 1000 Å as shown in FIG. 2(F). Next, the structure of FIG. 2(F) is heat-treated in a nitrogen atmosphere at 620° C. for 60 seconds to react the titanium layers 20 and 21 with the amorphous silicon layer 22 to form a titanium silicide layer 21' as shown in FIG. 2(G). This structure of FIG. 2(G) is then dipped into a solution of hydrogen peroxide and ammonia held at 70° C. whereby the titanium silicide layer 21' is selectively removed as shown in FIG. 2(H). In FIG. 2(H), the amorphous silicon layer 22 extends substantially continuously along the groove.

Figure 2I:
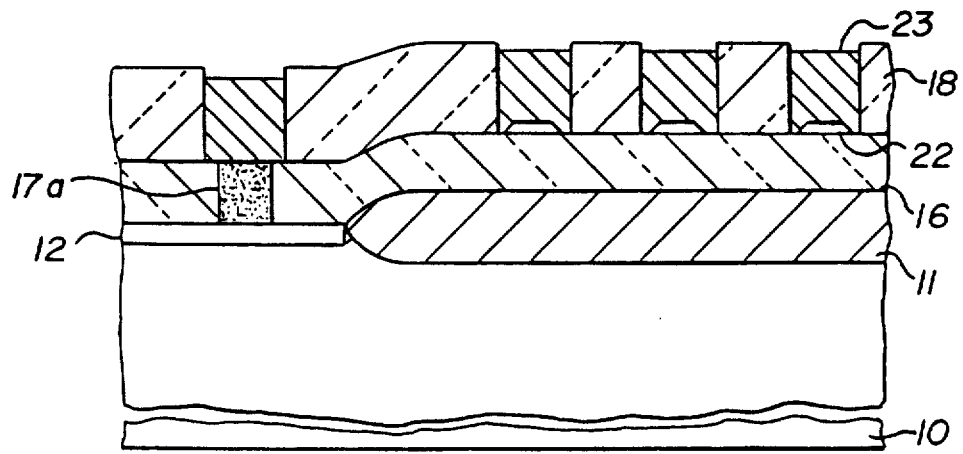

Next, using this amorphous silicon layer 22 as a nuclei of crystal growth, tungsten is deposited in the groove 19 by reduction of $WF_6$, using hydrogen as reductant. In one typical example, the deposition is performed at 400° C. and 0.2 Torr with a flow rate of 10 SCCM for $WF_6$ and 2 SLM for hydrogen. Alternatively, deposition of tungsten may be made by reduction of $WF_6$ by silane. In this case, the temperature of deposition may be set at 250° C., the pressure at $3 \times 10^{-2}$ Torr, the flow rate of $WF_6$ at 3 SCCM and the flow rate of silane at 3 SCCM, together with a carrier gas of hydrogen with a flow rate set at 600 SCCM. As a result, a tungsten layer 23 fills the groove 19 starting from its bottom to its top as shown in FIG. 2(I). Further, the structure of FIG. 2(I) is heat treated at 900° C. for 20 minutes to react the amorphous silicon layer 22 with tungsten layer 23 thereabove. As a result, there is formed a tungsten interconnection conductor wire 23' containing silicon and having an improved contact with the underlying PSG layer 16. Note that the wire 23' corresponds to the wire 10b of FIG. 1.

Figure 2J:
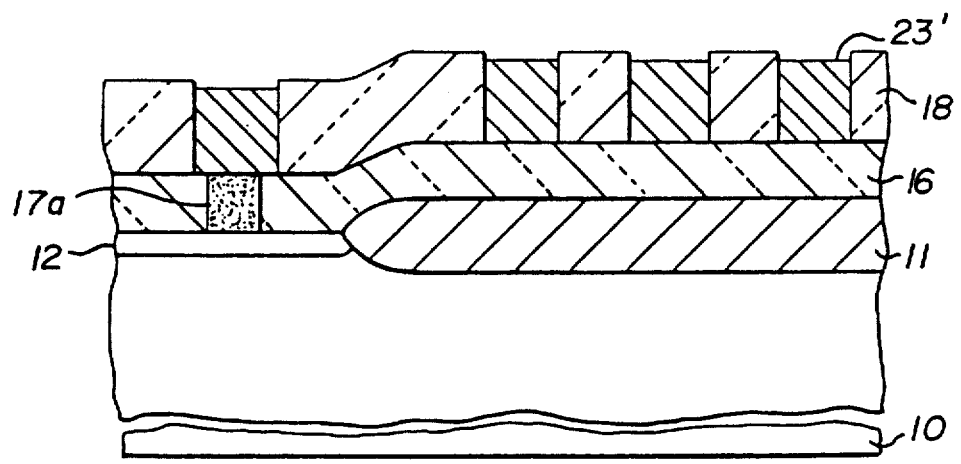

The tungsten conductor wire 23' thus grown in the groove already provided on the insulator layer 18 has various advantages such as substantially flat top surface suitable for multilevel interconnection as can be seen from FIG. 2(J), substantially void-free structure as a result of the selective growth of tungsten proceeding from the bottom to the top of the groove, high yield by avoiding deposition of tungsten in a form of large sheet which tends to invite the separation of the tungsten sheet from the insulator layer underneath, and good electrical insulation between adjacent wires by directly growing the wires in the grooves.

In this embodiment, the metal layers 20 and 21 is not limited to titanium but other refractory metals such as tungsten, tantalum, molybdenum, cobalt, zirconium, hafnium and the like may also be used. Further, the method of forming the layer 22 is not limited to sputtering of amorphous silicon but may be the chemical vapor deposition of polysilicon or amorphous silicon.

Next, a second embodiment of the present invention will be described with reference to FIGS. 3(A)–(H). In the drawings, these parts corresponding to those parts already described with reference to preceding drawings are given identical reference numerals and the description thereof will be omitted.

Figure 3A:
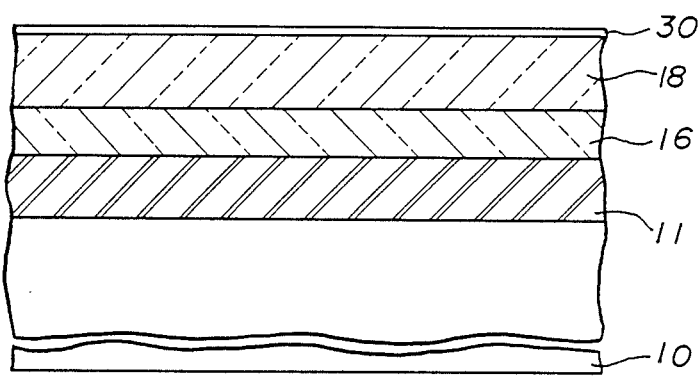
FIGS. 3(A)–(H) are cross sectional views showing various steps of forming the structure of FIG. 1 according to a second embodiment of the present invention.
Figure 3B:
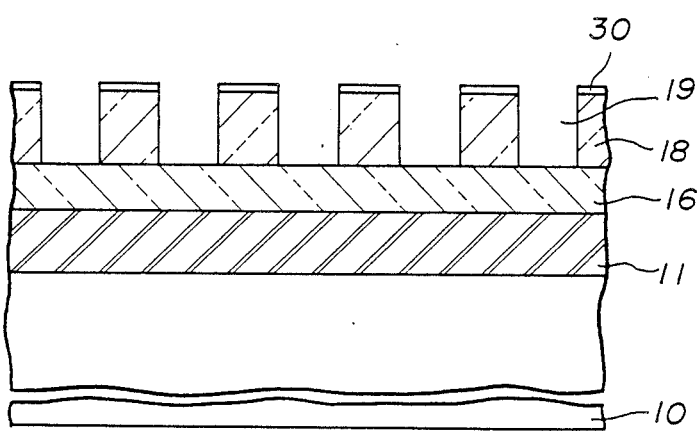
Figure 3:
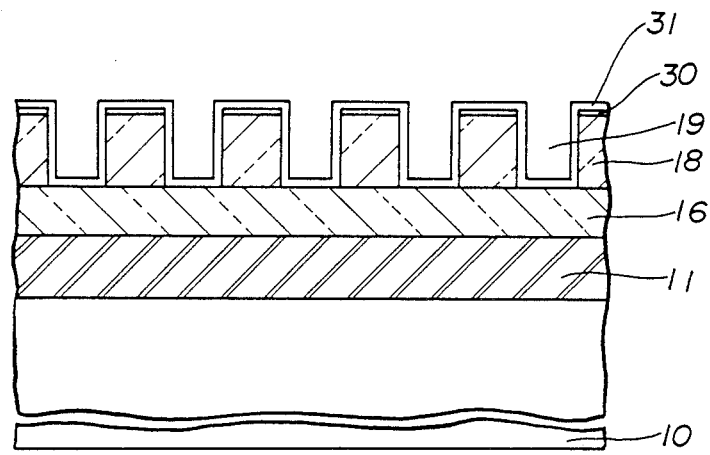
Figure 3:
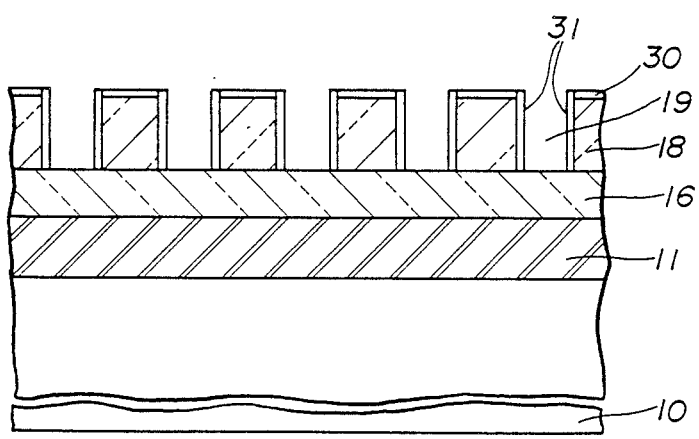
Figure 3E:
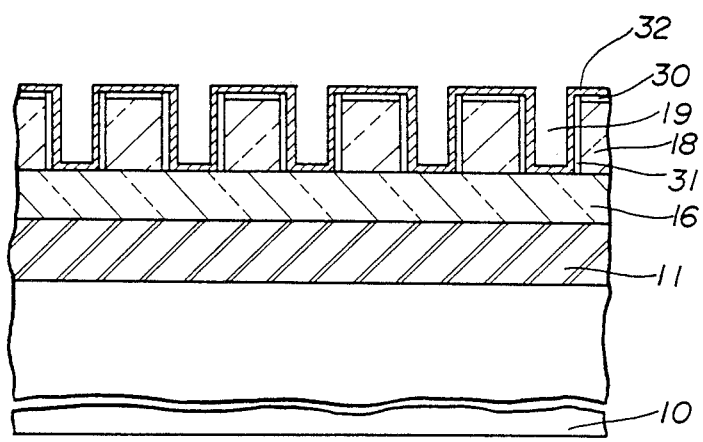
Figure 3F:
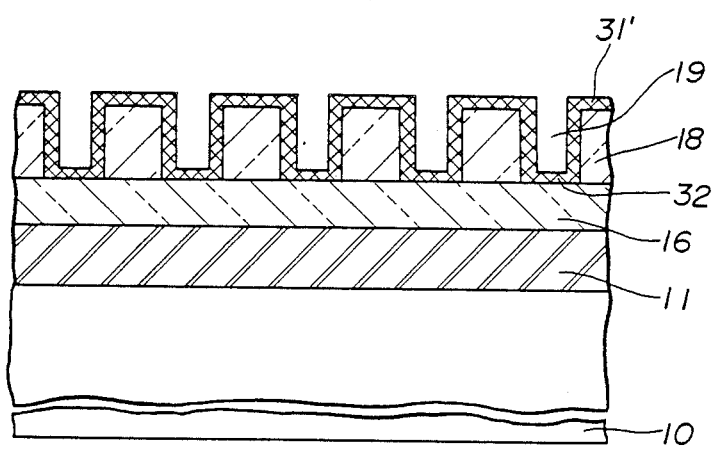

In this embodiment, too, the structure of FIG. 2(A) serves for the initial structure of the process and in a step of FIG. 3(A), a polysilicon layer 30 is deposited by chemical vapor deposition for a thickness of about 1000 Å. Next, the structure of FIG. 3(A) is subjected to RIE in combination with photolithographic patterning to form the groove 19 such that the groove 19 penetrates through the layer 18 as well as through the polysilicon layer 30 as shown in FIG. 3(B). Further, a polysilicon layer 31 is deposited on the structure of FIG. 3(B) for about 1000 Å by chemical vapor deposition to form a structure of FIG. 3(C), and a part of the polysilicon layer 31 at the top of the insulator layer 18 and at the bottom of the groove 19 is removed by RIE using a mixture of $CF_4$ and oxygen as the etching gas. Thus, a structure shown in FIG. 3(D) is obtained in which the polysilicon layer 31 is left only on the side wall of the groove 19. In this structure, note that the top of the insulator layer 18 is also covered by the polysilicon layer 30 deposited at the step of FIG. 3(A) and only the bottom of the groove 19 is exposed. At the bottom of the groove 19, the top of the insulator layer 16 is exposed. Next, a tungsten layer 32 is sputtered on the structure of FIG. 3(D) for a thickness of about 1000 Å to form a structure of FIG. 3(E). The structure of FIG. 3(E) is then heat-treated at 800° C. for 60 seconds so that the tungsten layer 32 is reacted with the polysilicon layers 30 and 31 covering the side wall of the groove 19 as well as the top of the insulator layer 18 and there is formed a tungsten silicide layer 31' as shown in FIG. 3(F). Note that the tungsten layer 32 at the bottom of the groove is substantially free from reaction as there is no immediate source of silicon in the vicinity of the layer 32.

Next, the structure of FIG. 3(F) is subjected to an isotropic plasma etching using sulfur hexafluoride ($SF_6$) as the etching gas to remove the silicide layer 31' selectively. As a result, a structure shown in FIG. 3(G) where the tungsten layer 32 is left only at the bottom of the groove 19 is obtained. The isotropic plasma etching employed in this step causes also the removal of layer 32 to some extent. However, such an unwanted etching of the layer 32 can be minimized by suitably choosing the condition of etching. In one example, the etching may be performed at 0.2 Torr while flowing $SF_6$ at a flow rate of 25 SCCM and while applying a radio frequency power of $0.4 W/cm^2$.

Figure 3G:
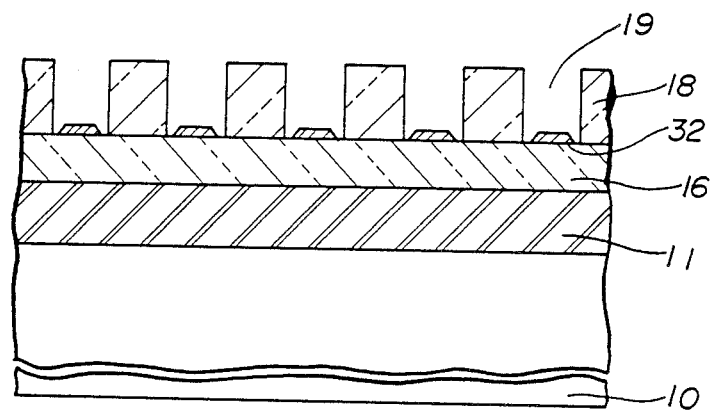
Figure 3H:
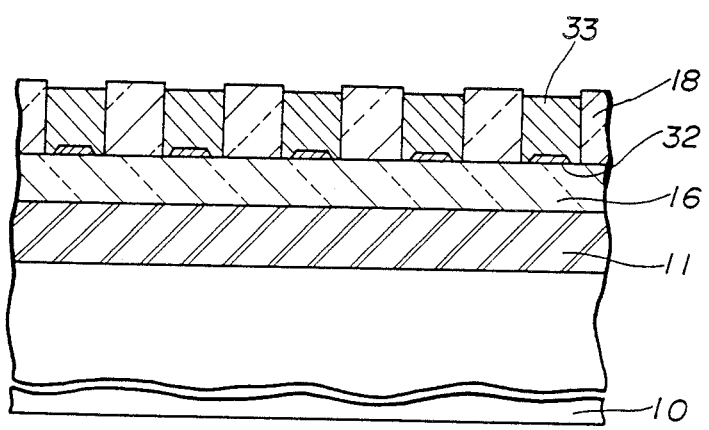

Next, the structure of FIG. 3(G) is subjected to heat treatment at 900° C. for 10 minutes and thereafter the deposition of tungsten in the groove 19 is performed using the tungsten layer 32 at the bottom of the groove 19 as the nuclei of crystal growth. The deposition is made by reduction of WF$_6$ by hydrogen or silane similarly to the case of the first embodiment. As a result, a structure shown in FIG. 3(H) where the groove 19 is filled completely by a tungsten interconnection wire 33 is obtained in correspondence to the structure of FIG. 1.

Next, a third embodiment of the present invention will be described with reference to FIGS. 4(A)–(J). In the drawings, the parts corresponding to these parts already described with reference to preceding drawings are given identical reference numerals and the description thereof will be omitted.

Figure 4A:
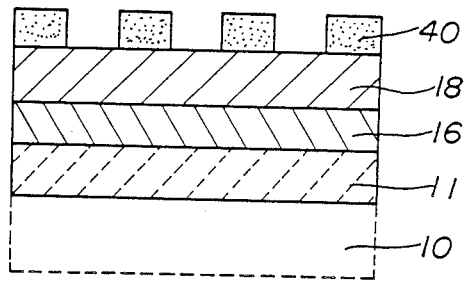
FIGS. 4(A)–(J) are cross sectional views showing various steps of forming the structure of FIG. 1 according to a third embodiment of the present invention.
Figure 4B:
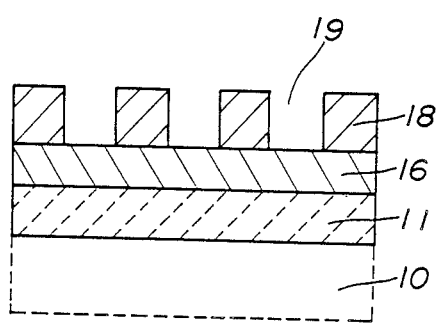
Figure 4C:
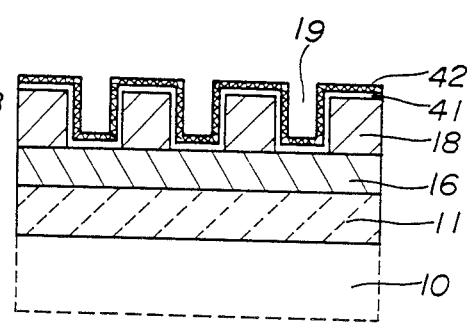

In a step of FIG. 4(A), the structure of FIG. 2(A) serving for the initial structure of the process is deposited with a photoresist 40 and patterned according to the desired interconnection pattern. Next, the structure is subjected to anisotropic etching using RIE such that there is formed the groove 19 according to the desired interconnection pattern as shown in FIG. 4(B). Note that the groove 19 connects the contact holes 17 (FIG. 1) provided to penetrate through the insulator layer 16 in correspondence to the semiconductor devices which are already filled by refractory metal such as tungsten. In FIG. 4(B), the photoresist 40 is already removed after etching. Next, the structure of FIG. 4(B) is covered by a polysilicon layer 41 deposited by chemical vapor deposition for example with a thickness of about 1000 Å. Further, the polysilicon layer 41 is subjected to oxidization by heat treatment whereby a silica layer 42 having a thickness of about 700 Å is formed on its top surface as illustrated in FIG. 4(C). Obviously, the thickness of the layers 41 and 42 are substantially smaller than the depth of the groove 19 penetrating the insulator layer 18 and there holds a relation $$d_1 + d_2 < D$$

where $d_1$ stands for the thickness of the layer 41, $d_2$ stands for the thickness of the layer 42, and D stands for the thickness of the layer 18.

Figure 4D:
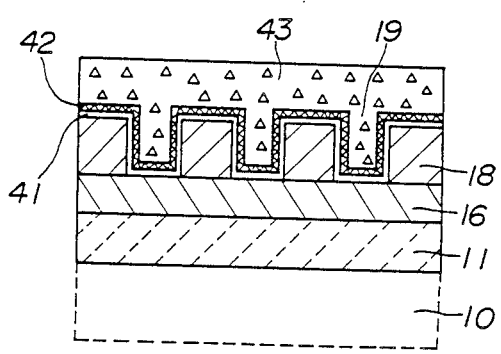
Figure 4E:
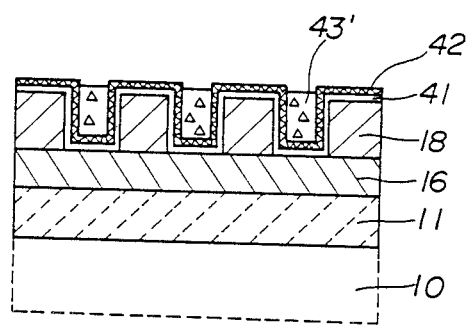
Figure 4F:
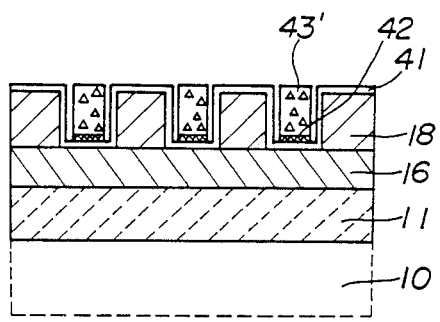

In a next step shown in FIG. 4(D), the structure of FIG. 4(C) is coated by a polymer layer 43 such as photoresist which is then bake at a predetermined temperature. Further, the polymer layer 43 is subjected to ashing by an oxygen plasma process until the silica layer 42 at the top of the insulator layer 18 is exposed. As a result, a structure shown in FIG. 4(E) in which the groove 19 is filled by the polymer layer 43 is obtained. Next, the silica layer 42 is removed by isotropic etching using the polymer layer 43 as the mask. The etching may be performed by dipping the structure of FIG. 4(E) in a buffered solution of hydrofluoric acid and a structure shown in FIG. 4(F) is obtained. In FIG. 4(F), the polysilicon layer 41 is exposed at the top of the insulator layer 18 as well as at the side wall of the groove 19. When the silica layer 42 is not completely removed from the side wall of the groove 19 particularly at the bottom part thereof, one may employ the anisotropic etching process such as RIE using CF$_4$ and CHF$_3$ as the etching gas. Small amount of silica remaining at the bottom part of the groove 19 along its side wall is tolerable.

Figure 4G:
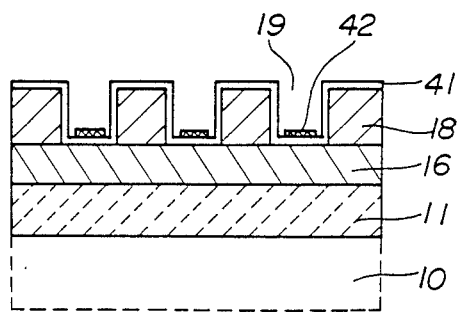
Figure 4H:
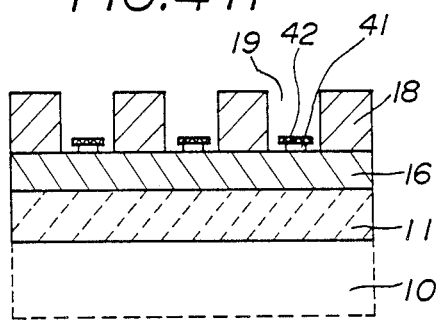
Figure 4I:
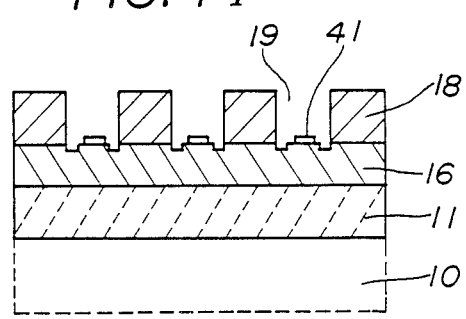

Next, the polymer layer 43' in the groove 19 is removed by oxygen plasma process such that the silica layer 42 protected by the polymer layer 43' at the bottom of the groove 19 is now exposed as shown in FIG. 4(G). Next, using the silica layer 42 as the mask, the polysilicon layer 41 is removed from the top of the insulator layer 18 as well as from the side wall of the groove 19. This process may be performed by isotropic plasma etching using etching gas such as CF$_4$. As a result, a structure shown in FIG. 4(H) is obtained. Alternatively, one may remove the polysilicon layer 41 prior to the removal of the polymer layer 43' by isotropic etching while using the polymer layer 43' as the mask.

Next, the structure of FIG. 4(H) thus obtained is dipped in a buffered solution of hydrofluoric acid to remove the silica layer 7 remaining at the bottom of the groove 19. As a result, a structure shown in FIG. 4(I) wherein the polysilicon layer 41 is exposed at the bottom of the groove 19 is obtained.

Figure 4J:
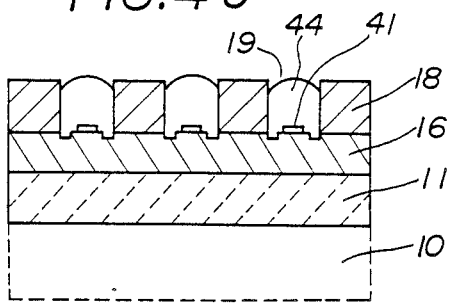

Further, using the polysilicon layer 41 at the bottom of the groove 19 as the nuclei, tungsten is grown in the groove 19 from its bottom to the top as shown in FIG. 4(J) in which the groove 19 is filled by a tungsten interconnection wire 44 corresponding to the wire 19b of FIG. 1. Such a filling of the groove 19 by tungsten may be performed by the reduction of WF$_6$ by hydrogen or silane similarly to the case of the first and second embodiments. As the growth of the tungsten forming the wire 44 proceeds from the bottom of the groove 19 to its top, and as the lateral growth of tungsten closing the top opening of the groove 19 does not occur because of the lack of nuclei at the side wall of the groove 19, the obtained wire 44 filling the groove 19 is substantially free from void and a reliable interconnection is achieved.

Next, a fourth embodiment of the present invention will be described with reference to FIGS. 5(A)–(D). In the drawings, parts corresponding to the parts already described with reference to the preceding drawings are given identical reference numerals and the description thereof will be omitted. This embodiment is based on a finding by the applicants that silicon nitride, though being an insulating material, acts as the nuclei for growth of refractory metals such as tungsten when the refractory metal is grown from a vapor phase.

Figure 5A:
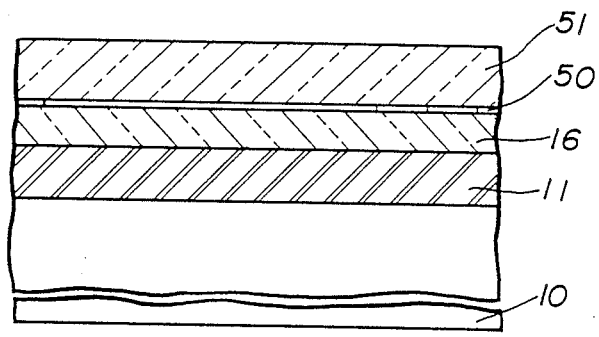
FIGS. 5(A)–(D) are cross sectional views showing various steps of forming the structure of FIG. 1 according to a fourth embodiment of the present invention.

In a step of FIG. 5(A), a silicon nitride layer 50 is deposited on the insulator layer 16 covering the integrated circuit with a thickness of about 0.1 μm by chemical vapor deposition and another PSG layer 51 is further deposited thereon with a thickness of about 1 μm also by chemical vapor deposition. Next, the PSG layer 51 as well as the silicon nitride layer 50 are covered by a photoresist (not shown), and after suitable photolithographic patterning, is subjected to anisotropic etching such as RIE until the silicon nitride layer 50 is etched. When it is detected that the silicon nitride layer 50 is etched by observation of a luminescent spectrum of nitrogen emitted responsive to etching of silicon nitride, the etching is immediately stopped. Thus, a structure shown in FIG. 5(B) in which a groove 52 penetrating through the PSG layer 51 as well as through the silicon nitride layer 50 is obtained. Note that the silicon nitride layer 50 is exposed at the bottom of the groove 52.

Figure 5B:
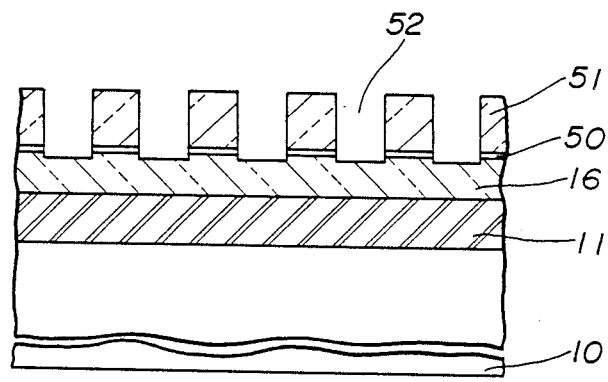
Figure 5C:
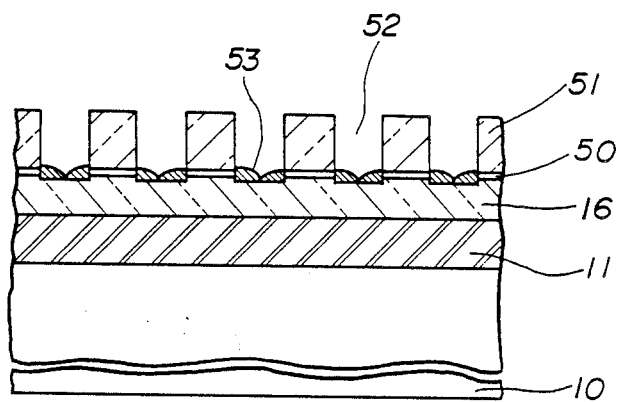
Figure 5D:
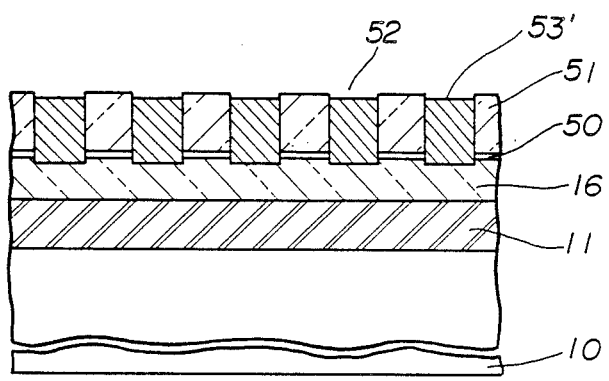

Next, in a step shown in FIG. 5(C), tungsten is deposited at the bottom of the groove 52 by chemical vapor deposition similarly to the case of the previous embodiments. Note that tungsten grows laterally from the silicon nitride layer 50 exposed at the bottom of the groove 52 and there is formed a tungsten layer 53 at the bottom of the groove 52. By continuing the deposition of tungsten on the tungsten layer 53, the groove 52 is filled completely by tungsten and an interconnection conductor wire 53' of tungsten embedded in the groove 52 is obtained as shown in FIG. 5(D). In the present embodiment, the silicon nitride layer 50 acting as the nuclei of the tungsten growth can be easily provided at the bottom of the groove, and the growth of tungsten is made from the bottom to the top of the groove 52 without creating void in the conductor wire 53'. Note that the lateral growth of the tungsten layer 53 occurs only at the bottom of the groove 52 and there is no risk that the top opening of the groove 52 is closed by the tungsten layer 53 thus deposited. This layer 53 acts as the nuclei for the subsequent growth of tungsten filling the groove 52. The growth of the layer 53 and the conductor wire 53' may be performed continuously.

In any of the foregoing embodiments, the growth of the tungsten interconnection conductor wire is made from the bottom to the top of the groove without creating void as there occurs no lateral growth of tungsten at the top or intermediate part of the groove. The conductor wire thus obtained is dense and fills the groove up to its top opening. Thus, there is formed a flat top surface in the obtained structure and the multilevel interconnection structure can be constructed thereabove without difficulty. It should be noted that the material used for the interconnection wire is not limited to tungsten but other refractory metals such as molybdenum, titanium, tantalum may be used as well. When molybdenum is used, molybdenum hexafluoride (MoF$_6$) may be used for the source gas. When titanium is used, titanium tetrachloride (TiCl$_4$) may be used for the source gas. Further, when tantalum is used, tantalum pentachloride (TaCl$_5$) may be used for the source gas. In any of these, a high yield is obtained because of the selective growth which occurs only in the groove and produces less mechanical stress with respect to the insulator layer underneath.

Further, the method of providing the nuclei 19a at the bottom of the groove may be performed by ion implantation of elements such as silicon at the time when the groove 19 is formed by using the photoresist for defining the groove 19 as the mask.

Further, the present invention is not limited to these embodiments but various variations and modifications may be made without departing from the scope of the invention.

What is claimed is:

1. A method of manufacturing a semiconductor integrated circuit, comprising steps of:
    forming at least one semiconductor device on a substrate;
    depositing an insulator layer on the substrate so as to bury said semiconductor device;
    providing a contact hole through the insulator layer for exposing a desired part of the semiconductor device;
    filling the contact hole by a refractory metal for electrical connection;
    covering the insulator layer by a second insulator layer;
    forming a groove through the second insulator layer according to a predetermined interconnection pattern such that the groove passes at least one contact hole and such that a top surface of the refractory metal filling the contact hole and a top surface of the first insulator layer are exposed by the groove;
    forming a material layer acting as a nuclei for crystal growth of a second refractory metal at a bottom of the groove substantially continuously along the groove, said step of forming the material layer acting as nuclei comprising consecutive steps of depositing a first material forming said material layer such that a side wall and the bottom of the groove are covered, and selectively removing the first material from the side wall; and
    depositing the second refractory metal in the groove until the groove is substantially filled by a conductor of the second refractory metal.

2. A method as claimed in claim 1 in which said first and second insulator layers comprise phosphosilicate glass.

3. A method as claimed in claim 1 in which said first and second insulator layers comprise silica.

4. A method as claimed in claim 1 in which said first and second refractory metals are chosen from a group comprising tungsten, molybdenum, titanium and tantalum.

5. A method as claimed in claim 1 further comprising, after the step of forming the groove and before the step of forming the material acting as nuclei, a step of covering the side wall of the groove by a second material capable of forming a compound when reacted with said first material, and another step of reacting the first material with the second material to form a compound layer covering the side wall of the groove, said step of selectively removing the first material from the side wall comprises a selective removal of the compound layer by etching.

6. A method as claimed in claim 5 in which said step of covering the side wall of the groove by the second material further comprises consecutive steps of depositing the second material on the second insulator layer including the groove after the step of forming the groove to cover a top of the second insulator layer, the side wall of the groove and the bottom of the groove, and removing the second material selectively from the top of the second insulator layer and from the bottom of the groove by anisotropic etching.

7. A method as claimed in claim 6 further comprising a step of depositing the second material directly on the second insulator layer before the step of forming the groove to form a second material layer, said step of removing the second material being performed so as to cause exposure of the second material layer thus provided directly on the second insulator layer, said step of depositing the first material causing deposition of the first material not only on the side wall and the bottom of the groove but also on the second material layer thus exposed, said step of reacting the first material with the second material further causing formation of the compound at the top of the second insulator layer as a result of reaction between said first and second materials, and said step of selectively removing the first material further causing removal of the compound from the top of the second insulator layer leaving the top of the second insulator layer exposed.

8. A method as claimed in claim 5 in which said first material comprises silicon and said second material comprises a material capable of forming silicide when reacted with silicon.

9. A method as claimed in claim 8 in which said second material is chosen from a group comprising titanium, tungsten, tantalum, molybdenum, cobalt, zirconium and hafnium.

10. A method as claimed in claim 5 in which said first material is chosen from a group comprising titanium, tungsten, tantalum, molybdenum, cobalt, zirconium and hafnium, and said second material comprises silicon.

11. A method as claimed in claim 1 in which said step of selectively removing the first material further comprises steps of selectively covering the material layer at the bottom of the groove by a mask, removing a part of the material layer not covered by the mask by etching, and removing the mask.

12. A method as claimed in claim 11 in which said step of selectively covering the material layer further comprises steps of providing the mask uniformly on the first material after the step of depositing the first material, filling the groove by an organic substance, removing a part of the mask covering the side wall by etching using the organic substance as another mask, and removing the organic substance from the groove.

13. A method as claimed in claim 12 in which said first material comprises silicon and said mask comprises silica formed by thermal oxidation of the first material.

14. A method as claimed in claim 1 further comprising a step of depositing silicon nitride on the first insulator layer after the step of filling the contact hole to form a silicon nitride layer covering a top of the first insulator layer, said step of forming the groove being performed such that the silicon nitride layer is exposed from a side wall of the groove at a bottom part of the groove adjacent to said bottom, and said step of forming the material layer comprises deposition of said second refractory metal on the silicon nitride layer exposed at the bottom of the groove.

* * * * *

UNITED STATES PATENT AND TRADEMARK OFFICE
CERTIFICATE OF CORRECTION

PATENT NO. : 4,983,543

DATED : January 8, 1991

INVENTOR(S) : Yasuhisa SATO et al

Figure 3A:
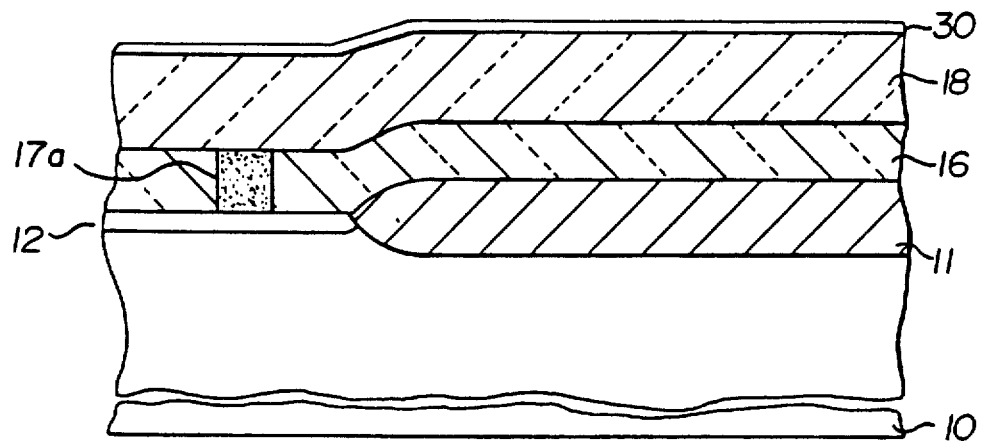
Figure 3B:
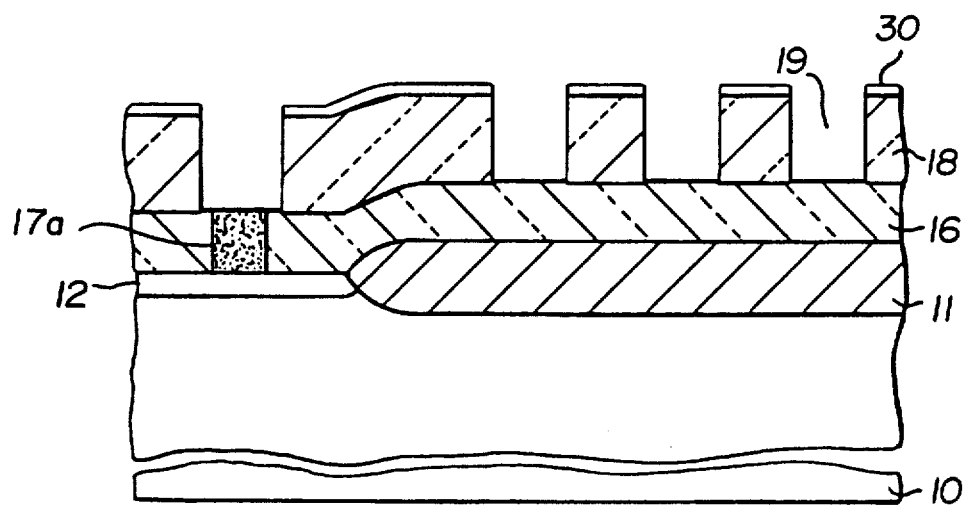
Figure 3C:
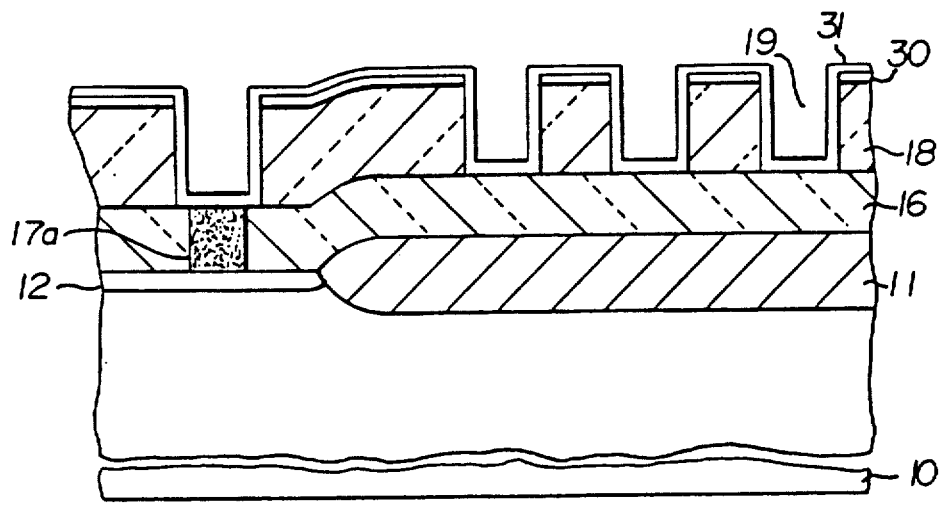
Figure 3D:
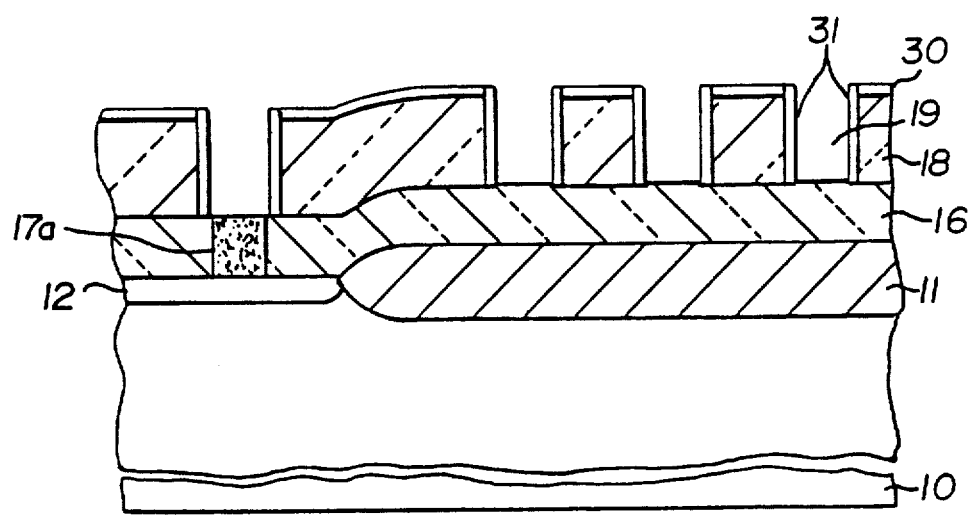
Figure 3E:
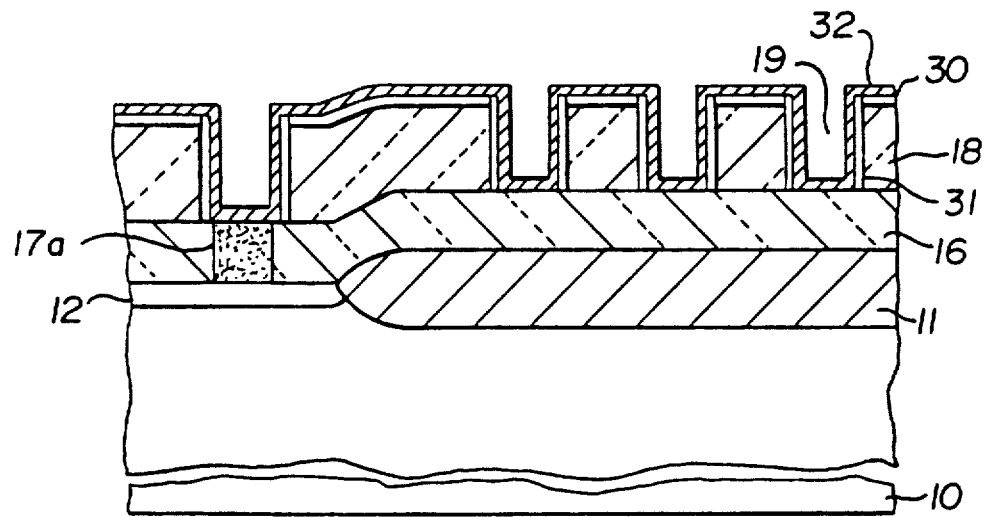
Figure 3F:
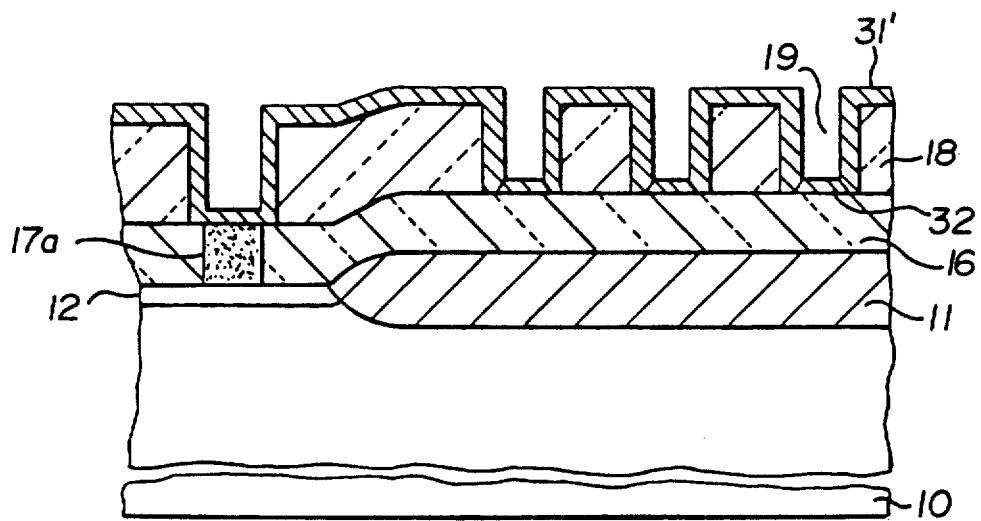
Figure 3G:
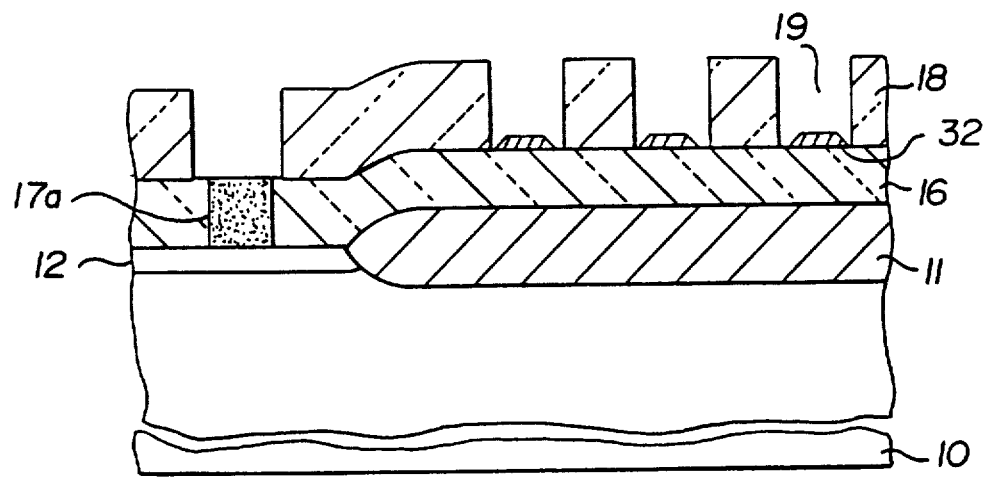
Figure 3H:
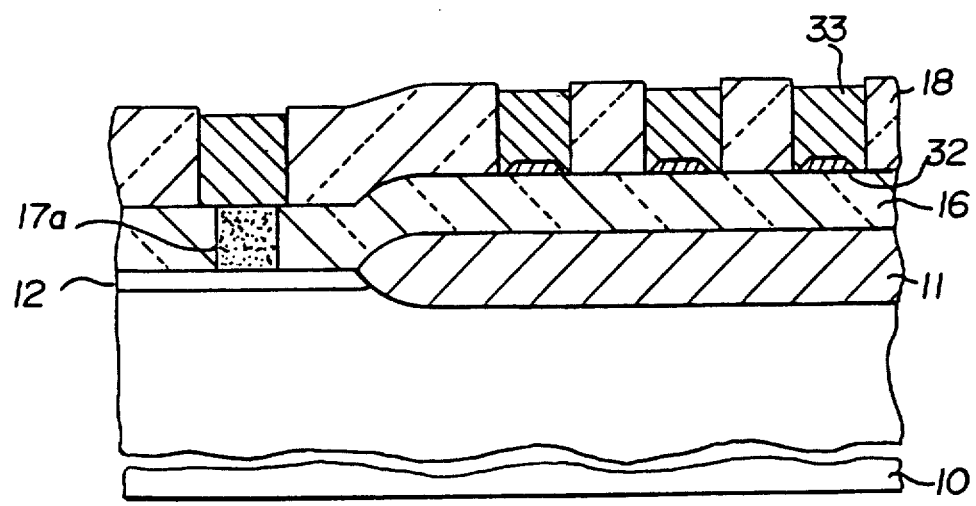
Figure 4A:
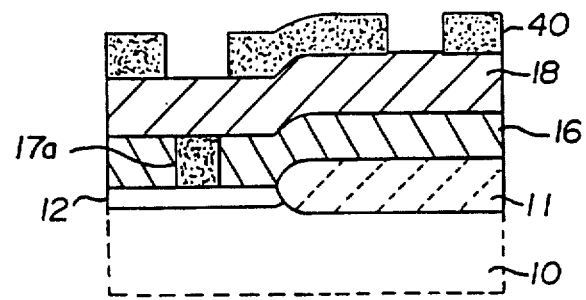
Figure 4B:
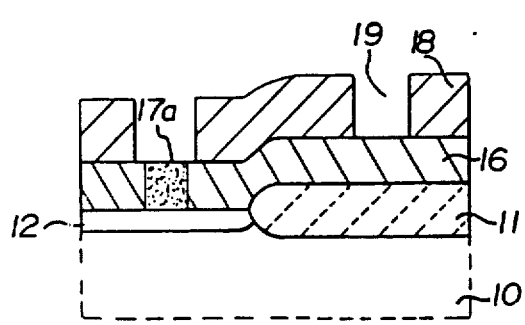
Figure 4C:
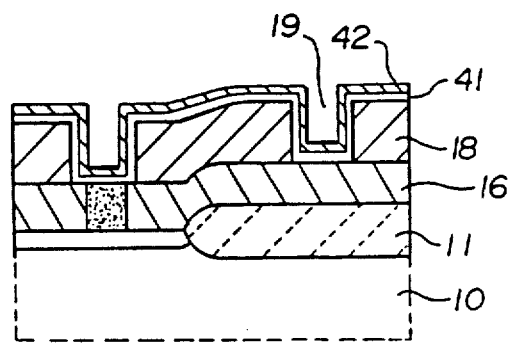
Figure 4D:
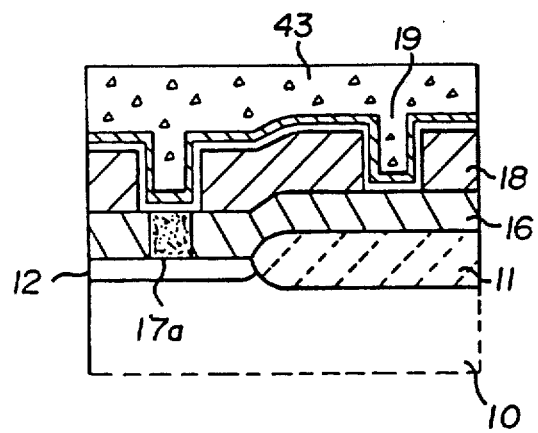
Figure 4E:
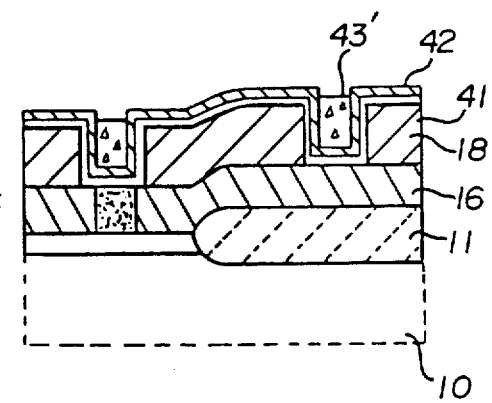
Figure 4F:
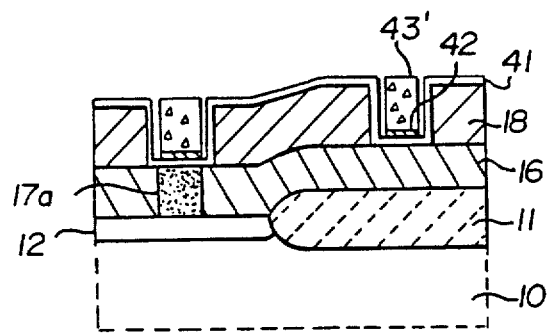
Figure 4G:
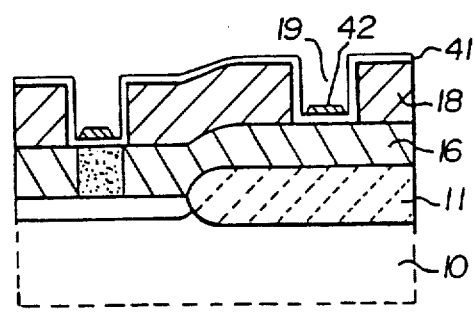
Figure 4H:
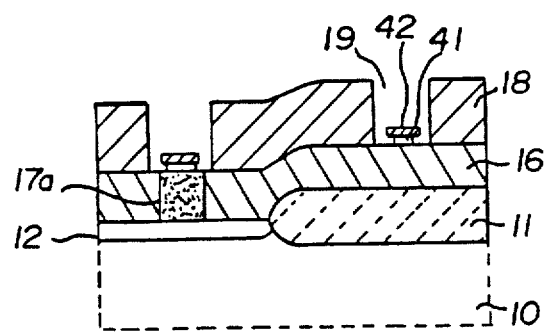
Figure 4I:
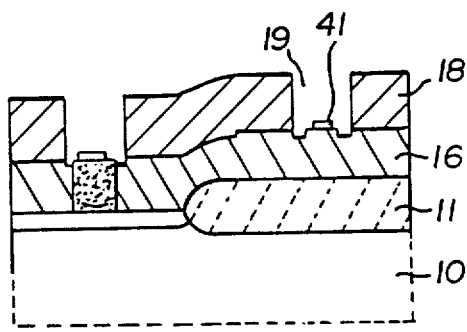
Figure 4J:
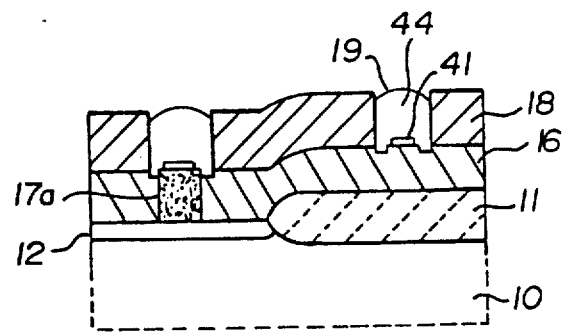
Figure 5A:
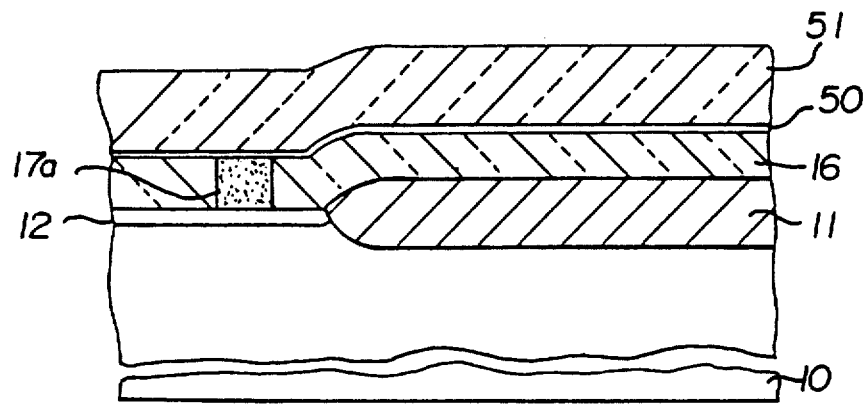
Figure 5B:
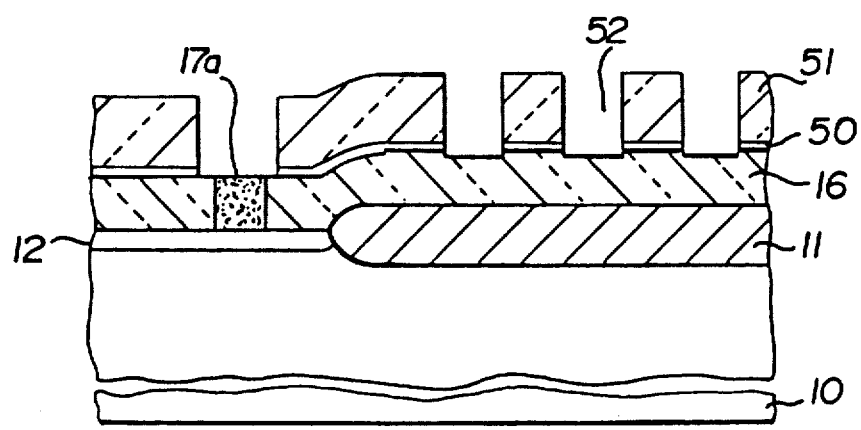
Figure 5C:
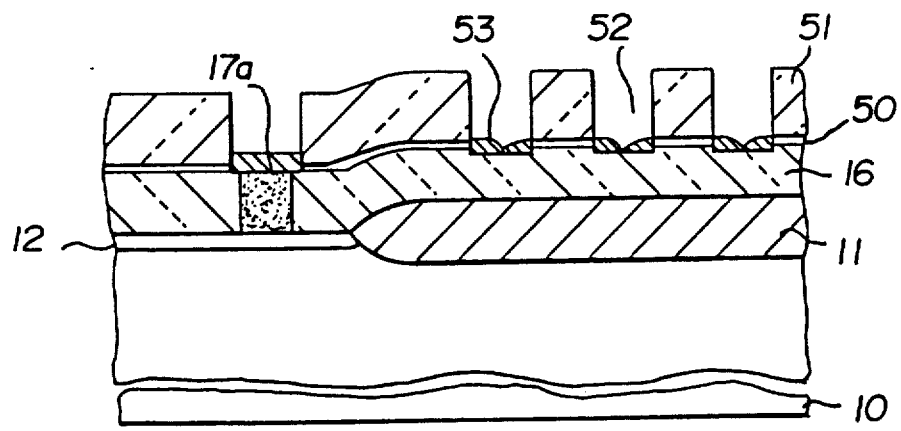
Figure 5D:
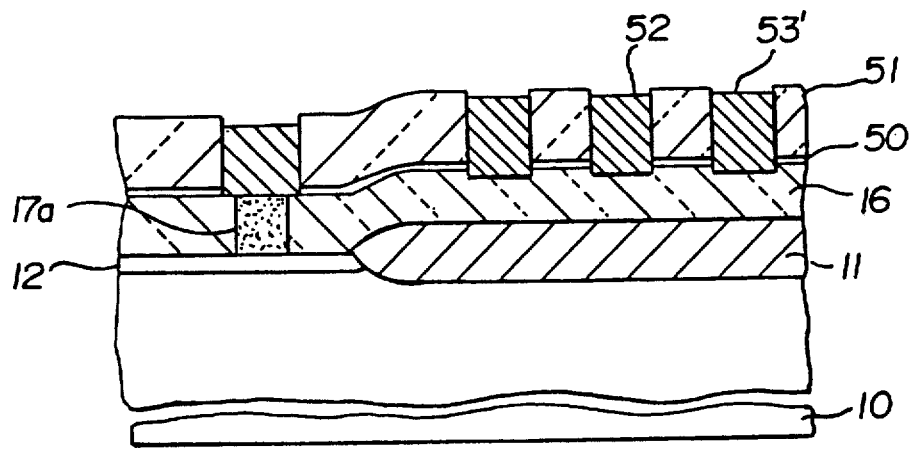

It is certified that error appears in the above-identified patent and that said Letters Patent is hereby corrected as shown below:

On the drawing sheet 8 of 14, delete Figs. 3C and 3D, and insert corrected Figs. 3C and 3D, as shown on the attached page.

On the drawing sheet 9 of 14, delete Figs. 3E and 3F, and insert corrected Figs. 3E and 3F, as shown on the attached page.

On the drawing sheet 10 of 14, delete Figs. 3G and 3H, and insert corrected Figs. 3G and 3H, as shown on the attached page.

On the drawing sheet 11 of 14, delete Figs. 4A-4E, and insert corrected Figs. 4A-4E, as shown on the attached page.

On the drawing sheet 12 of 14, delete Figs. 4F-4J, and insert corrected Figs. 4F-4J, as shown on the attached page.

On the drawing sheet 13 of 14, delete Figs. 5A and 5B, and insert corrected Figs. 5A and 5B, as shown on the attached page.

Signed and Sealed this

Sixth Day of October, 1992

Attest:

DOUGLAS B. COMER

*Attesting Officer*  *Acting Commissioner of Patents and Trademarks*

UNITED STATES PATENT AND TRADEMARK OFFICE
CERTIFICATE OF CORRECTION

PATENT NO. : 4,983,543
DATED : January 8, 1991
INVENTOR(S) : Yasuhisa SATO et al It is certified that error appears in the above-identified patent and that said Letters Patent is hereby corrected as shown below:

On the drawing sheet 14 of 14, delete Figs. 5C and 5D, and insert corrected Figs. 5C and 5D, as shown on the attached page.

On the drawing sheet 2 of 14, delete Figs. 2A and 2B, and insert corrected Figs. 2A and 2B, as shown on the attached page.

On the drawing sheet 3 of 14, delete Figs. 2C and 2D, and insert corrected Figs. 2C and 2D, as shown on the attached page.

On the drawing sheet 4 of 14, delete Figs. 2E and 2F, and insert corrected Figs. 2E and 2F, as shown on the attached page.

On the drawing sheet 5 of 14, delete Figs. 2G and 2H, and insert corrected Figs. 2G and 2H, as shown on the attached page.

On the drawing sheet 6 of 14, delete Figs. 2I and 2J, and insert corrected Figs. 2I and 2J, as shown on the attached page.

On the drawing sheet 7 of 14, delete Figs. 3A and 3B, and insert corrected Figs. 3A and 3B, as shown on the attached page.